United States Patent [19]

Xiong

[11] Patent Number: 5,550,748
[45] Date of Patent: Aug. 27, 1996

[54] REGION SEARCH FOR DELAY ROUTING AND SIGNAL NET MATCHING

[75] Inventor: Xiao-Ming Xiong, San Diego, Calif.

[73] Assignee: Cadence Design Systems, Inc., San Jose, Calif.

[21] Appl. No.: 216,157

[22] Filed: Mar. 22, 1994

[51] Int. Cl.⁶ ..................................... G06F 17/50
[52] U.S. Cl. .................... 364/488; 364/489; 364/490; 364/491
[58] Field of Search ................... 364/488–491

[56] References Cited

U.S. PATENT DOCUMENTS

| | | | |
|---|---|---|---|
| 4,500,963 | 2/1985 | Smith et al. | 364/300 |
| 4,636,965 | 1/1987 | Smith et al. | 364/491 |
| 5,065,355 | 11/1991 | Hayase | 395/800 |
| 5,072,402 | 12/1991 | Ashtaputre et al. | 364/491 |
| 5,119,317 | 6/1992 | Narikawa et al. | 364/512 |
| 5,187,671 | 2/1993 | Cobb | 364/490 |
| 5,339,253 | 8/1994 | Carrig et al. | 364/489 |
| 5,361,214 | 11/1994 | Aoki | 364/490 |
| 5,375,069 | 12/1994 | Satoh et al. | 364/490 |

OTHER PUBLICATIONS

Cong et al., "Matching–Based Methods for High–Performance Clock Routing," IEEE Transactions on Computer–Aided Design of Integrated Circuits and Systems, vol. 12, No. 8, Aug. 1993, pp. 1157–1169.

Hanafusa et al., "Three–Dimensional Routing for Multilayer Ceramic Printed Circuit Boards," 1990 Int'l Conference on Computer Aided Design, pp. 386–389.

Bakoglu, H. B., "Circuits, Interconnections, and Packaging for VSLI", *Addison–Wesley Publishing Company*, pp. 1–2. (No date).

Burstein, M., et al., "Timing Influenced Layout Design", *22nd Design Automation Conference*, No. 9.2, 124–130 IEEE (1985).

Dunlop, A. E., et al., "Chip Layout Optimization Using Critical Path Weighting", *21st Design Automation Conference*, No. 9.2, 133–136 IEEE (1984).

Tada, T., et al., "Router System for Printed Wiring Boards of Very High–Speed, Very Large–Scale Computers", *23rd Design Automation Conference*, No. 44.1, 791–797 IEEE (1986).

Teig, S., et al., "Timing–Driven Layout of Cell–Based ICs" *VLSI Systems Design*, May 1986, pp. 63–73.

Xiong, X. M., et al., "PAS: A Stand Alone Placement Annotation System for High Speed Designs", *Custom Integrated Circuits Conference*, 9.1.1–9.1.5 IEEE (1993).

Xiong, X. M, et al., "Automatic Signal net–Matching for VSLI Layout Design", *IEEE* (1989), pp. 524–525.

Xiong, X. M., et al. "Interconnect and Output Driver Modeling of High Speed Designs", *IEEE* (1993), pp. 507–510.

*Primary Examiner*—Kevin J. Teska
*Assistant Examiner*—Leigh Marie Garbowski
*Attorney, Agent, or Firm*—Fenwick & West LLP

[57] ABSTRACT

A system and method performs signal net matching during delay routing. The delay router employs a region search for placing pseudo pins in a search region that will satisfy specified time delay constraints for a given signal net. The search region is an octagonal region defined by Manhattan detour lengths using derived wire length constraints as applied to a bounding box for the signal net. Any sequential router can be used to search the search region for free points. A first search phase finds delay paths to all free points in the search region from an arbitrary source pin. A second search phase then searches the search region for delay paths connecting a sink pin to one of the free points. Any delay path that connects the source and sink pin through a free point in the search region satisfies the time delay constraints. Dynamical routing can be implemented during the search phases as needed. Once all the signal nets have been routed, a group of signal nets to be matched is rerouted with the search region defined by the length of the longest routed path in the group. This ensures that all the signal nets in the group meet the specified time delay constraint.

23 Claims, 5 Drawing Sheets

REGION SEARCH FOR DELAY ROUTING AND SIGNAL NET MATCHING

BACKGROUND

1. Field of Invention

The present invention relates generally to the field of automated design techniques, and more particularly to methods and systems for routing and matching signal nets in integrated circuits.

2. Background of the Invention

As VLSI fabrication technology reaches submicron device dimensions and circuit speeds falls below sub-nanosecond, interconnect delays become the dominant factor in determining circuit performance. Further, as integrated circuit designs increase in size, interconnect delays between circuit cells become larger and account for an increasing percentage of total circuit delay. To ensure circuit performance under these critical conditions, signal nets connecting circuit cells typically have time delay constraints. During circuit design, the delay constraints are usually translated into minimum and maximal wire length constraints in a layout system. The problem of routing the signal nets to satisfy the delay constraints can then be stated as follows: given a placement of various cells, how to route a given set of signal nets to a wire length between the maximal and minimal wire length constraints.

During delay routing, some signal nets must be matched. Signal net matching is the process of ensuring that the nets in given matching set of signal nets are connected by specified length wires, within a given tolerance. Signal net matching is used to eliminate clock skew and racing, to match the paths of circuit cells having differential drivers, and to ensure simultaneous output switching of cells, e.g. for outputs arriving simultaneously at a data bus or other circuit element.

Current delay routers suffer methodological limitations that in turn result in implementation deficiencies. First, existing routers solve the routing problem using only the delay constraints, independent of other layout considerations. When such routers are integrated into a layout system, they are invoked either in a pre-routing stage or in an after-routing (post-process) stage. Thus, the overall layout system performance is severely degraded, for example, by a decrease in the interconnect completion rate or an increase in the CPU time required for routing.

Another methodological problem with existing delay routers is their inability to produce arrangements that completely satisfy all delay constraints. A typical delay routing approach having this problem is to weigh the signal nets, i.e. net priorities are assigned based on a static timing analysis. Signal nets with larger weights are processed earlier and the wire lengths are controlled by a routing cost function. Generally, several routing iterations are needed to achieve a reasonably good result by adjusting signal net weights such that most of the signal nets will meet the delay requirements. However, an optimal solution generally cannot be determined because of the extensive CPU time needed for computation, and the convergence problem. Accordingly, most of the practical layout systems use a special delay router, which generally have the following limitations.

There are basically two methods for connecting two points with a specified length of wire: 1) Find a path from the start point to the end point, then adjust the wire length; 2) Find a path from the start point to the end point, controlling the wire length at the same time. In method 1, if the delay net (the added path that satisfies the delay constraints) is routed first, the length adjustment will almost guarantee that the delay contraints are satisfied in a typical design. However, the added wire length for the delay net will occupy a large amount of routing space, thereby significantly increasing the probability that the whole design cannot be fully routed. This is an unacceptable practice because the main objective of layout routing is to complete all connections. On the other hand, if the wire length of the delay net is adjusted using free space after all signal nets have been routed, the routability will not be affected. However, after routing, there is not much free space available for changing the wire length to satisfy the delay constraints. Thus, a large number of delay nets fail to reach their specified length in a typical design because of existing wires, although a feasible solution exists.

Method 2 is more appealing methodologically than method 1, but it is a well-known fact that tracking wire length during maze or geometry-based routing is very expensive in CPU time, especially in non-uniform grid or gridless environments. Various approaches have been adopted to surmount this difficulty, without sufficient success. For example, diamond routing iteratively selects a random detour point on a truncated diamond and attempts to route from the start point to the end point through the detour point. This approach is of limited practical application because of the impossibility of selecting and searching through all detour points. Also, only two pin nets can be handled by typical diamond routers.

It is desirable therefore to provide a delay router that overcomes the limitations of existing routers. Specifically, it is desirable to provide a delay router that provides complete routing solutions without extensive CPU time, and without limiting the interconnect completion rate. Further, it is desirable to provide a delay router that can match signal nets during the delay routing process. Finally, it is desirable to provide a delay router that is adaptable to a variety of existing design environments.

SUMMARY OF THE INVENTION

A method for delay routing a signal net uses a region search process that defines a search region around the signal net as the area within which a delay path connecting any pseudo pin to the signal net would satisfy the maximum and minimum delay constraints of the signal net. The shortest delay path from a source pin of the signal net passing through a free point to a sink pin of the signal net is selected, and a pseudo pin is placed at the free point along the shortest delay path, and the signal net is routed along a routed path including the shortest delay path. A number of signal nets are matched by setting a net length constraint to the length of a longest routed path, and then rerouting all signal nets using the definition of the search region as the net length constraint.

The search region is defined by estimating a signal net wire length and defining an outer and inner search boundary as a function of the signal net wire length. The signal net wire length is estimated by defining a one-trunk Steiner tree for the signal net, and the search boundaries are based on Manhatten detour lengths using the estimated signal net wire length. During the search for the shortest delay path, the search region is segmented into a plurality of polygons, to reduce search time. The shortest delay path is located by searching the search region for a free point, then searching for a delay path from a source pin through the free point to a sink pin, and repeating the path searches until there is a path connecting each free point to a source pin and sink pin, and then selecting the delay path with the shortest length.

A delay router includes a net length estimator for estimating a wire length for connecting a signal net, a search region constructor for creating a search region around the signal net such that a delay path connecting any pseudo pin placed in the search region will satisfy the maximum and minimum delay constraints for the signal net, a search engine for searching the search region for paths connecting a source pin and a sink pin, and a path selector for selecting a shortest delay path.

DESCRIPTION OF THE PREFERRED EMBODIMENT

Figure 1:
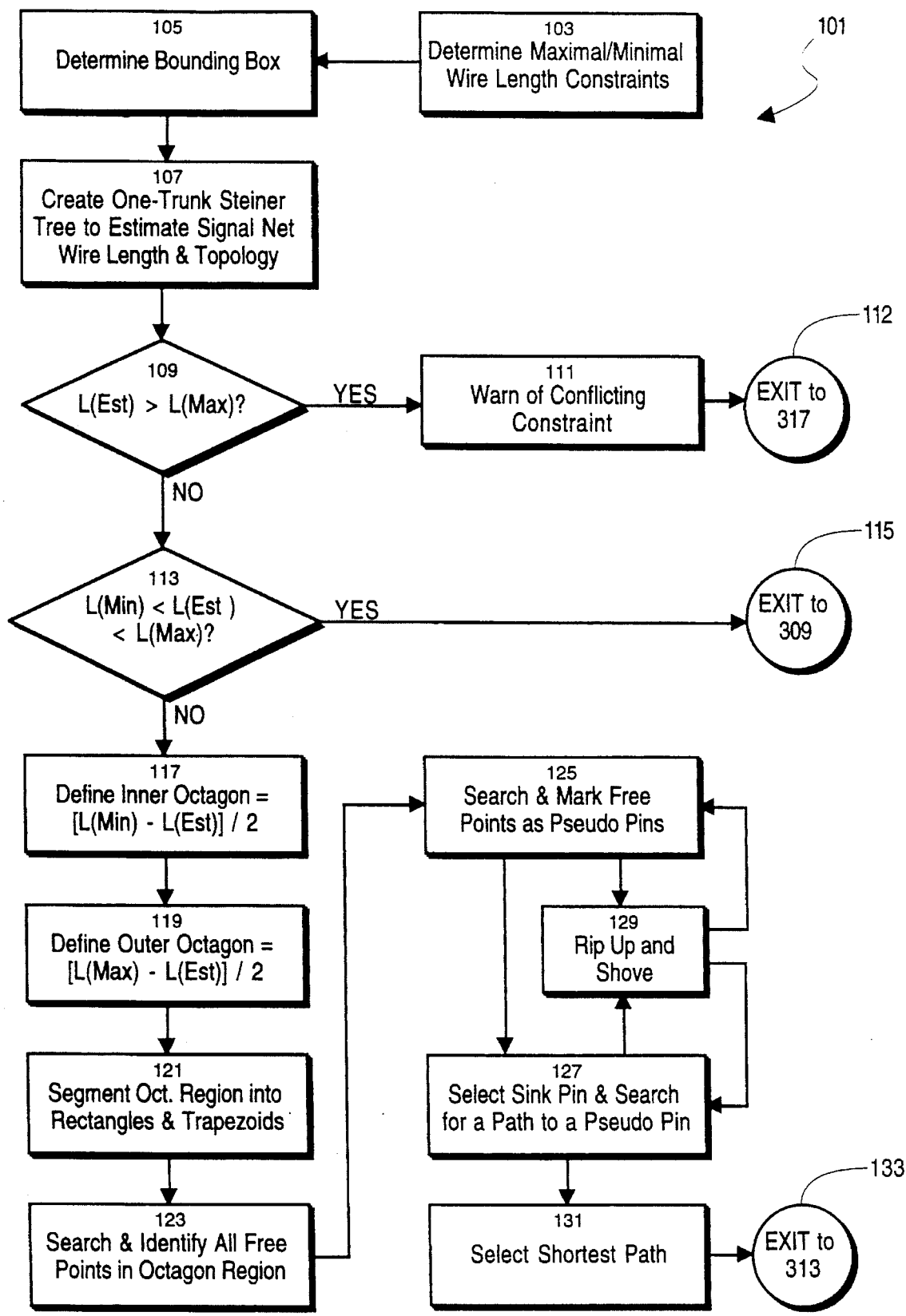
FIG. 1 is a flow chart of an embodiment of the region search process.

Referring now to FIG. 1, there is shown a flowchart of one embodiment of the region search process 101 for delay routing. Region search process 101 can be employed with various sequential routers, such as maze routers, geometry-based gridless router or line probe routers, or any other router in which signal nets are routed according to a scheduled order resulting from the optimization of multiple variables, such as routability, wire length, priority, and the like. In the preferred embodiment, region search process 101 is used with a maze router, as described below with respect to FIGS. 3 and 4.

Figure 2A:
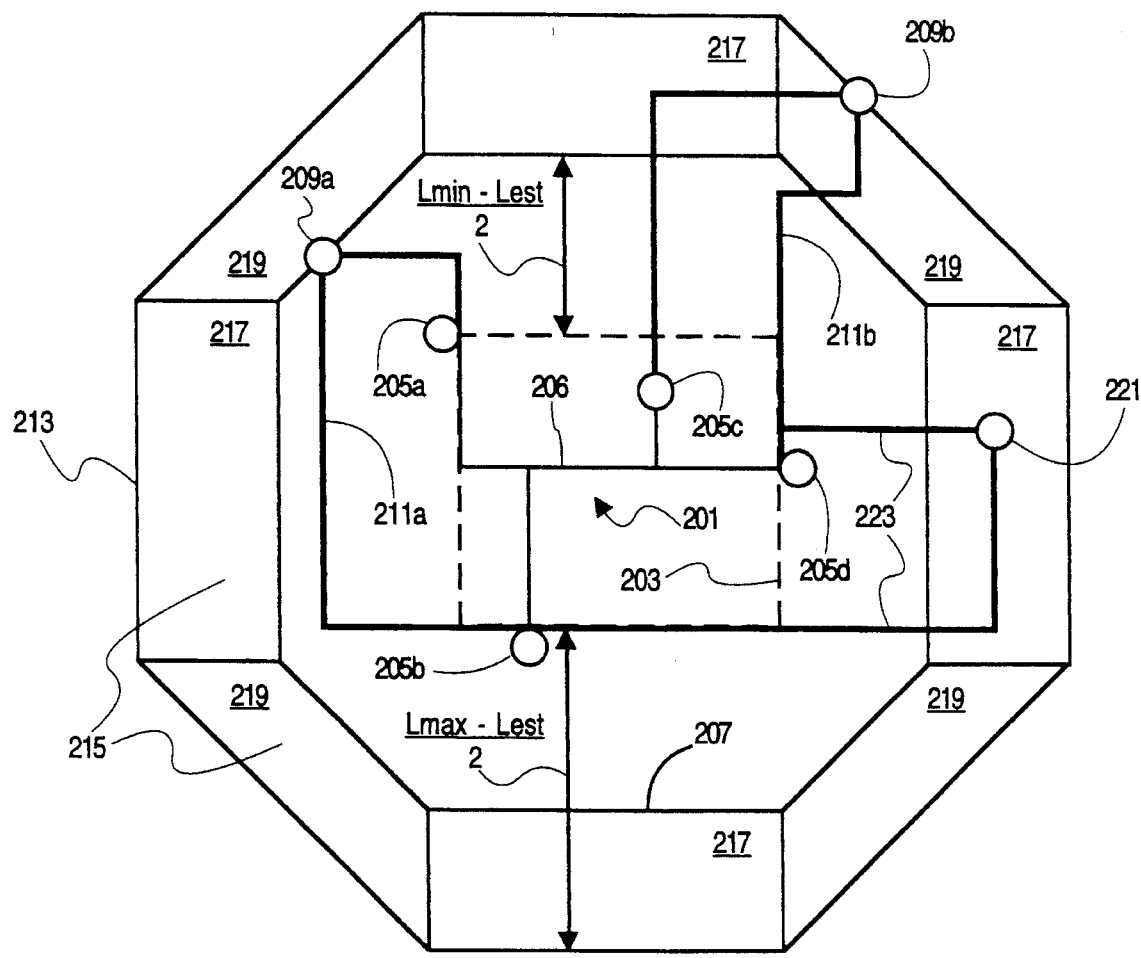
FIG. 2A–2B are pictorial illustrations of the octagon search region used in the region search process.

Referring also to FIG. 2A, there is shown a signal net 201 including pins 205 for delay routing according to the present invention. First, for the given signal net 201 to be routed, the maximal wire length $L_{max}$ and minimal wire length $L_{min}$ constraints are determined 103 from specified time delay constraints in a conventional manner. $L_{max}$ and $L_{min}$ define the physical wire lengths for implementing the desired time delay is constraints in the circuit operation. A bounding box 203 of the signal net 201 is then determined 105. The bounding box 203 is the minimum rectangular boundary including all the pins 205 of the signal net 201, i.e. the rectangle having a lower left corner {xl, yl} and an upper right corner {xr, yr}, where (xl) equals the minimum x-coordinate of pins 205, (yl) equals the minimum y-coordinate, (xr) equals the maximum x-coordinate, and (yr) equals the maximum y-coordinate. A one-trunk Steiner tree 206 is then created 107 to approximate the routing topology and to obtain an estimated wire length $L_{est}$ for routing the signal net 201.

With the estimated wire length Lest three routing solution conditions are possible. If the estimated wire length is greater 109 than the maximum wire length constraint, ($L_{est} > L_{max}$), a warning message is issued 111, and the region search process 101 exited 112 because the conflicting constraint requirements prevents the signal net 201 from being routed. If the estimated wire length is less 113 than the maximum wire length constraint, and greater than the minimum wire length constraint ($L_{min} < L_{est} < L_{max}$), the region search process 101 is exited 115 as the signal net 201 can be routed 309 (FIG. 3) as having no length constraint because the wire length constraint will be automatically satisfied by the one-trunk Steiner tree.

Falsifying both conditionals 109, 113 leaves the case where the estimated wire length $L_{est}$ is less than both the maximum wire length constraint $L_{max}$, and the minimum wire length constraint $L_{min}$ ($L_{est} < L_{min} < L_{max}$). It is in this condition that region search process 101 determines the optimal delay routing. Accordingly, a collection of points forming an inner octagon 207 surrounding the signal net 201 is defined 117. The inner octagon 207 is the collection of the points that permit a uniform sum of the detour Manhattan lengths equal to $$(L_{min} - L_{est})/2 \qquad (Eq.1)$$

along the X and Y axes. The inner octagon 207 is the set of points whereon a detour point 209a can be placed and a delay path 211a starting from a pin 205a, passing through the detour point 209a and ending at a second pin 205b would have a length equal to the minimum wire length constraint $L_{min}$, assuming the delay path 211a does not detour by both positive and negative amounts along any segment between the pin 205 and the detour point 209.

Similarly, an outer octagon 213 is defined 119 by determining the collection of points that permit a uniform sum of the detour Manhattan lengths equal to $$(L_{max} - L_{est})/2 \qquad (Eq.2)$$

along the X and Y axes. The outer octagon 213 is the set of points whereon a detour point 209b can be placed and a delay path 211b starting from a pin 205c, passing through the detour point 209b and ending at a second pin 205d would have a length equal to the maximum wire length constraint $L_{max}$.

The octagon region 215 between the inner and outer octagons 207, 213 is the area within which a pseudo pin 221 can be placed and added to the signal net 201 and the shortest delay path 223 that connects any two pins 205 and the added pseudo pin 221 will satisfy the timing delay constraints, as defined by the wire length constraints $L_{max}$ and $L_{min}$. Thus, the octagon region 215 can be searched to determine the placement of a pseudo pin 221 and the appropriate routing path. Following the definition of the inner and outer octagons 207, 213, the octagon region 215 between them is segmented 121 into four rectangles 217 and four trapezoids 219.

Figure 2B:
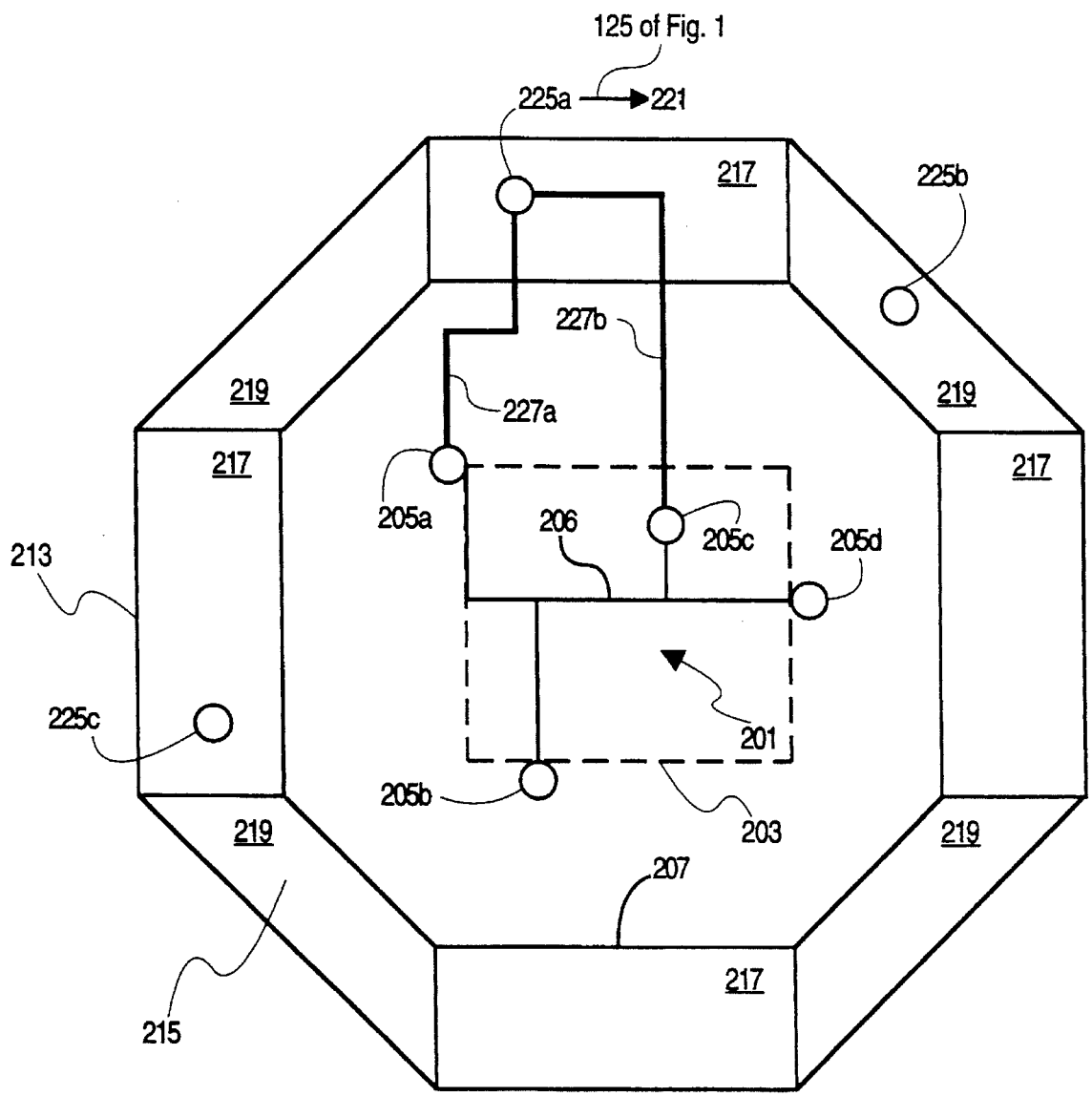

Referring to FIG. 2B, the octagon region 215 is searched 123 for all free points 225 which are then marked. A free point 225 is a location through which a wire or a via can pass. Free point searching 123 can be done very efficiently, with a CPU time linear to the number of points in the octagon region 215, by processing the derived rectangles is 217 and trapezoids 219 independently. By segmenting octagon region 215 into four rectangles 217 and four trapezoids 219, all the free points 225 inside octagon region 215 can be marked 123 efficiently because there all points inside the inner octagon 215 are not searched 123, thereby reducing the amount of time required to search the octagon region 215. For each rectangle 217 or trapezoid 219, each point inside the polygon is examined to determine if it is occupied by a pin, a via, a wire, or any blockage. If not, the point is marked 123 as a free point 225.

Once all of the free points 225 are marked 123, the octagon region 215 is searched 125, 127 to identify potential locations for pseudo pins 221 and delay paths which satisfy the time delay constraints. The search phases can be performed using any sequential router. In the preferred embodiment a maze router is employed. In the first search phase 125, any one of the pins 205 of the signal net 201 is selected as a source pin 205a, and a three dimensional wave expansion from the source pin 205a within the octagon region 215 is begun. When the wave encounters a free point 225a, then a delay path 227a connecting the source pin 205a and the free point 225a has been found; the free point 225a is marked 125 for use as a pseudo pin 221. The search 125 is repeated until the entire octagon region 215 has been searched and all free points 225 for placing a pseudo pin 221 are marked. This first search phase 125 locates all possible delay paths starting from the source pin 205a of the signal net 201 and ending at a pseudo pin 221.

The second search phase 127 identifies delay paths that can complete the delay paths identified in the first search phase 125, thus satisfying the timing constraints for the signal net 201. Accordingly, another pin 205 of the signal net 201 is selected as a sink pin 205c, and a three dimensional wave expansion from the sink pin 205c in the same area is begun. If the wave goes through a marked free point 225a, then a delay path 227b connecting the sink pin 205c and the marked free point 225a has been found. Since both the source pin 205a and the sink pin 205c connect to the marked free point 225a it follows that the delay path 227 connecting source and sink pins 205 passes through a point in the octagon region 215. By definition of the octagon region 215, this delay path 227 satisfies the time delay constraints for the signal net 201, because the octagon region 215 is defined by the wire length constraints $L_{max}$ and $L_{min}$. A pseudo pin 221 can be placed at the marked free point 225 and routed along a routed path including delay path 227 and the one-trunk Steiner tree to satisfy the time delay constraints for the signal net 201.

Since the first search phase 125 finds all locations for pseudo pins 221, it is possible to find a feasible delay path in the second search phase 127 if one exists because of the characteristics of full sequential routers. Where there are multiple possible delay paths 227 connecting the source pin 205a and the sink pin 205c, the delay path 227 having the shortest length is selected 131 for routing with the one-trunk Steiner tree.

Dynamical routing, specifically rip-up rerouting and shove 129, can be implemented during the first and second search phases 125, 127. If during the first search phase 125 no free delay path 227a, i.e. a delay path that does not cross existing wires and/or vias of other signal nets, can be found, the signal nets crossing the path having a lowest associated cost (as determined by an arbitrary cost function) will be shoved 129 away into adjacent free space. If there is no free space to shove the problematic signal nets, the signal nets will be ripped up 129 and re-scheduled to route later.

Figure 3:
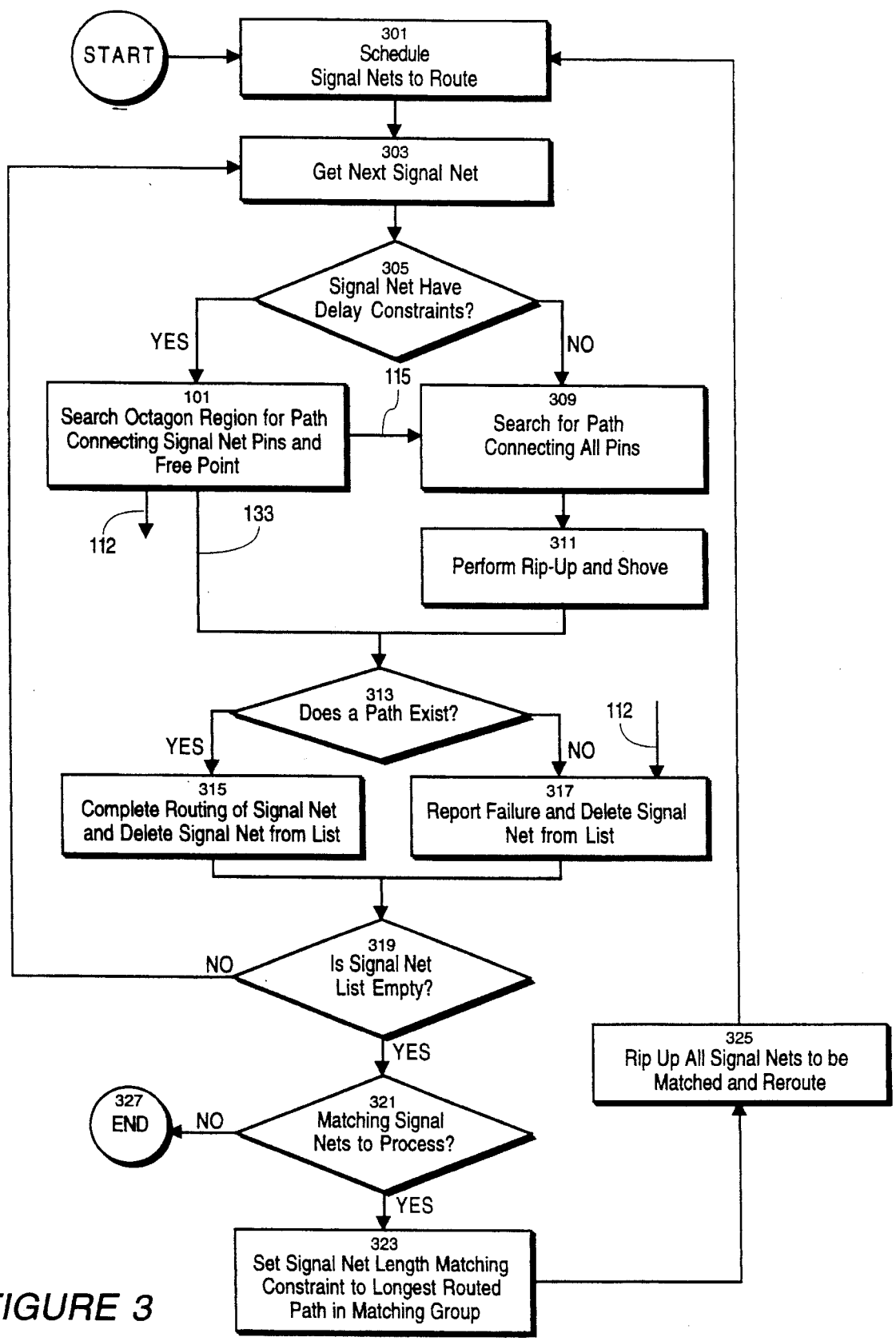
FIG. 3 is a flowchart of a delay routing process using the region search process.

As stated above, the region search process 101 can be implemented in a number of existing routers. FIG. 3 is a flowchart for one method of delay routing and signal net matching with the region search process 101. The signal nets to be routed are scheduled 301 according to any desired parameters, and the various signal nets that are to be matched for timing delays are identified. An iterative loop is begun and the first scheduled signal net is retrieved 303. A conditional tests 305 whether there are time delay constraints that must be satisfied during routing. If so, then the signal net is searched with the region search process 101 for satisfactory routing paths. If not, then the signal net is searched 309 for routing paths conventionally, including rip up and shove 311 as needed. In either case, if a path is located 313, then the routing is completed 315 and the signal net is deleted from the list of signal nets to be routed. If no path was found 313, then the failure is reported and the signal net is again deleted from the scheduled signal net list. If the scheduled signal net list is not empty 319, then the next signal net is retrieved 303 for routing.

Once all the signal nets have been routed, a conditional tests 321 whether any of the signal nets were identified 301 to be processed for matching of time delay constraints. If not, the delay routing is completed, and the process exited 327. If so, the signal net in a group of signal nets to be matched that has the longest delay constraint, as determined by the longest routed path 227 is identified, and the length of the longest routed path 227 is set 323 as the signal net length matching constraint. The signal nets to be matched are ripped up 325 and then added to the scheduled list of signal nets to be routed 301 again. For each of these signal nets to be matched then, their maximal and minimum delay constraints are set to the signal net length matching constraint. This ensures that during the next routing pass, the inner octagon 207 and the outer octagon 213 for each signal net will occupy the same set of points, collapsing the octagon search region 215. The first and second search phases 125, 127 will thus locate a pseudo pin 221 on the octagon region 215 for each of the signal nets to be matched, thereby routing each signal net with a delay path 227 that satisfies the same time delay constraint. Accordingly, the signal net matching problem is translated into a delay routing problem, with signal net matching performed during the routing for time delay constraints.

In the preferred embodiment, the region search process 101 for delay routing is implemented in a maze routing environment. But the present invention is not restricted to maze routing, and can, for example, be employed in a gridless geometry based routing environment. In such an alternative embodiment, after the octagon region 215 is defined, free routing spaces inside the octagon region 215 are generated as potential target geometries for marking free grid points. Then, three dimensional line probe search techniques can be applied, replacing three dimensional wave expansion. In these embodiments, since the region search process 101 for delay routing is embedded in an existing router, no extra memory is required. For each delay path 227, the wire length is predetermined when the octagon region 215 is defined using equations 1 and 2. Processor time if efficiently used because no wire length calculations are required during the first and second search phases 125, 127.

Figure 4:
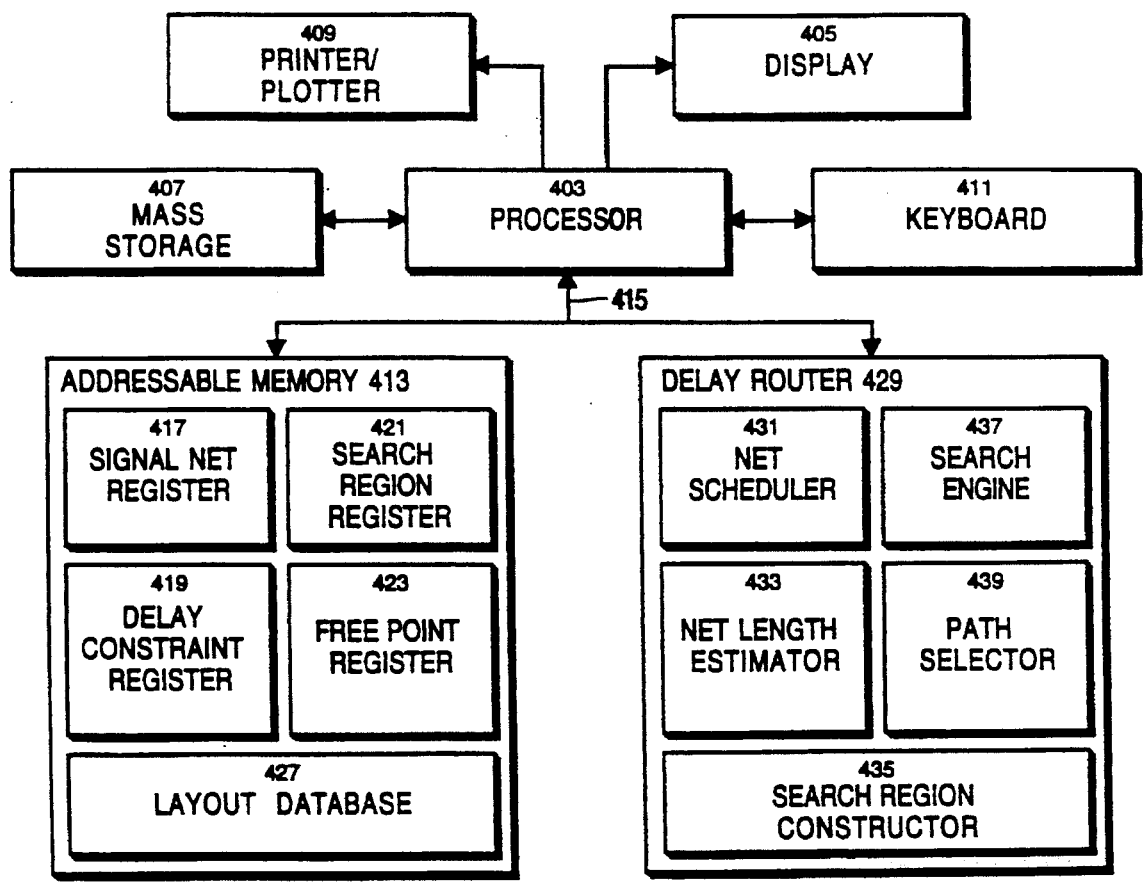
FIG. 4 is a block diagram of a system with a delay router using the region search process.

Referring now to FIG. 4, there is shown a block diagram of one embodiment of s a system 401 for delay routing using a delay router 429 incorporating the region search process 101 of the present invention. The preferred embodiment of the system 401 is implemented on a general purpose computer such as a Sun Microsystems, Inc. workstation. Utilizing dedicated software incorporating a delay router 429 using the region search process 101, the general purpose computer specifically configures memory and system peripherals for the purpose of executing the method of the present invention. System 401 comprises a processor 403, a display 405, a mass storage 407, a printer 409, a keyboard 411, an addressable memory 413, and a delay router 429. The processor 403 retrieves from, and stores information to, the addressable memory 413 in response to the operations of the delay router 429. The keyboard 411 and display 405 is provide a user interface to the delay router 429, the former allowing the designer to instruct the delay router 429 to perform the region search process 101 and related routing operations, and the latter allowing the designer to view a graphic representation of the signal nets of the layout during the routing process. The printer 409 generates a permanent record of the routed layout, indicating the routed paths for the various signal nets.

The processor 403 and the delay router 429 are connected to various memories in the addressable memory 413 through a data bus 415. Connected to the data bus 415 in addressable memory 413 are a signal net register 417, a delay constraint register 419, a search region register 421, a free point register 423, and a layout database 427. These registers are accessed by the processor 403 during the operation of the delay router 429.

The delay router 429 includes a number of modules for delay routing using the region search process 101 of the present invention. These modules include a net scheduler 431, a net length estimator 433, a search region constructor 435, a search engine 437, and a path selector 439.

The net scheduler 431 schedules 301 the list of the signal nets 201, and their respective pins 205, to be routed, based on various input parameters regarding priority, routability, and the like. The list is stored by the processor 403 in the signal net register 417. The net scheduler 431 also manages the sequence of delay routing for all of the listed signal nets 201, including retrieving 303 the signal nets to be routed, deleting 315, 317 the signal nets from the scheduled signal net list, testing 319 for completion of the routing schedule, determining 321 if any signal nets need to be matched, setting 323 the net length matching constraint, and ripping up 325 the signal nets to be matched. Thus the net scheduler manages both the initial routing passes and the signal net matching passes of the delay router. The net scheduler 431 obtains data on the signal nets from the layout database 427, which contains a coordinate description of the symbolic layout, including the location of all pins of the signal nets.

The net length estimator 433 determines 103 the maximal wire length constraint $L_{max}$ and minimal wire length constraint $L_{min}$ as stored in the delay constraint register 419. The net length estimator 433 then determines 105 the bounding box 203, and creates 107 the one-trunk Steiner tree 206, thereby obtaining the estimated wiring length $L_{est}$; these values can also be stored in the delay constraint register 419, or in the signal net register 417. The net length estimator 433 compares 109, 113 the estimated wire length $L_{est}$ with the maximal wire length constraint $L_{max}$ and minimal wire length constraint $L_{min}$ to determine whether the signal net can be routed, and whether the wire length constraints will be automatically satisfied.

The search region constructor 435 creates the octagon search 215 by defining 117, 119 the inner and outer octagons 207, 213, using the bounding box 203, and the wire length constraints stored in the delay constraint register 419. The search region constructor 435 stores the coordinates of the inner and outer octagons 207, 213 in the search region register 421. The search region constructor 435 then segments 121 the octagon search region 215, again storing the coordinates of the various rectangles 217 and trapezoids 219 in the search region register 421.

The search engine 437 searches 123 and marks of all free points 225 in the search region 215. The identified free points 225 are stored in the free point register 423. The search engine 437 then performs first search phase 125 to identify potential locations for pseudo pins 221 and delay paths 227 that satisfy the wire length constraints. The free point register 423 is updated by the processor 403 for each free point 225 which can be used to locate a pseudo pin 221.

The search engine 437 then performs the second search phase 127 to locate a delay path 227 from a sink pin 205 to the marked free point is 225. Each delay path 227 can be stored with its associated pins 205 in the signal net register 417. The search engine 437 also performs the rip-up rerouting and shove 129 as needed. Once the various delay paths 227 have been identified by the search engine 437, the path selector 439 selects 131 the delay path having the shortest length. The signal net is then routed 313 with a routed path including the one-trunk Steiner tree 206 and the delay path 227, and stored in the layout database 427. The net scheduler 431 updates the signal net register 417 to remove 315 the routed signal net from the scheduled signal net list.

The region search process 101 is an efficient method for delay routing and signal net matching. Unlike other delay routers, which route a signal net to a required wire length with incomplete or suboptimal results, the method of the present invention will to route a signal net to its required length, if a feasible solution exists, by searching all predefined pseudo pins. Because the region search process is embedded into existing routers there is minimum impact on routability, computational time, and memory usage. In contrast to special delay routers in conventional layout systems, the region search process can be implemented in a general router used to route all signal nets with and without delay constraints. Thus, layout system integration is simplified and concurrent routing is achieved because no pre-routing or after-routing process is required. This delay routing approach can also support multiple pin nets and dynamical routing, specifically rip-up re-route and shove.

I claim:

1. A computer implemented method for routing a signal net having any number of pins and having maximum and minimum delay constraints, comprising of:

a) defining a search region around the signal net such that a delay path coupling any pseudo pin placed in the search region between any two pins of the signal net satisfies the maximum and minimum delay constraints;

b) locating a free point in the search region having a shortest delay path from a source pin of the signal net through the free point to a sink pin of the signal net;

c) placing a pseudo pin at the free point;

d) routing the signal net along a path including the shortest delay path from the source pin through the pseudo pin to the sink pin;

e) selecting one of the at least one delay paths; and f) routing the signal net along a path including the selected delay path.

2. The method of claim 1, further comprising:

determining from a plurality of signal nets to be matched, a longest routed path in one of the plurality of signal nets;

setting a net length constraint equal to a length of the longest routed path; and repeating a) through f) for each of the plurality of signal nets to be matched using the net length constraint to define the maximum and minimum delay constraints for the search region.

3. The method of claim 1, wherein defining a search region around the signal net, comprises:

determining a signal net boundary surrounding the signal net, the signal net boundary defined by a plurality of coordinates;

determining an estimated wire length for connecting the signal net;

defining an outer search boundary as a function of the estimated wire length, the maximum delay constraint, and the coordinates of the signal net boundary; and defining defining an inner search boundary as a function of the estimated wire length, the minimum delay constraint, and the coordinates of the signal net boundary, wherein the search region comprises an area between the outer and inner search boundaries.

4. The method of claim 3 wherein determining an estimated wire length for connecting the signal net, comprises:

defining, for ally number of pins in the signal net, a one-trunk Steiner tree connecting all pins of the signal net, the estimated wire length equal to a total length of the one-trunk Steiner tree.

5. The method of claim 3, wherein the outer search boundary comprises:

all points having a distance from the signal net boundary equal to one half of a difference between a maximum wire length constraint and the estimated wire length, where the maximum wire length constraint is computed from the maximum delay constraint.

6. The method of claim 3, wherein the inner search boundary comprises:

all points having a distance from the signal net boundary equal to one half of a difference between the minimum wire length constraint and the estimated wire length, where the minimum wire length constraint is computed from the minimum delay constraint.

7. The method of claim 1 wherein defining a search region further comprises segmenting the search region into a plurality of polygons prior to searching the search region.

8. The method of claim 1, wherein the step of locating comprises:

a) searching the search region for at least one free point;

b) searching from the source pin for a first delay path to the free point;

c) searching from the sink pin for a second delay path to the free point;

d) combining the first and second delay paths to a final delay path;

e) repeating b) through d) until for each free point there is a final delay path connecting the free point to a source pin and a sink pin; and f) selecting the final delay path having a shortest length.

9. The method of claim 1, wherein the maximum delay constraint is not equal to the minimum delay constraint.

10. A delay router for delay routing a signal net having any number of pins, and further having maximum and minimum delay constraints, comprising:

a net length estimator for determining an estimated wire length for connecting all of the pins of the signal net;

a search region constructor for defining a search region around the signal net, such that a delay path coupling any pseudo pin placed in the search region between any two pins of the signal net satisfies the maximum and minimum delay constraints;

a search engine for locating at least one delay path from a source pin of the signal net through a free point in the search region to a sink pin of the signal net; and a path selector for selecting a shortest delay path, wherein the search engine routes a path including the shortest delay path.

11. The delay router of claim 10 wherein the net length estimator creates a one-trunk Steiner tree connecting all pins of the signal net, the estimated wire length equal to a total length of the one-trunk Steiner tree.

12. The delay router of claim 10 wherein the search region constructor segments the search region into a plurality of polygons.

13. The delay router of claim 10 wherein the search engine searches the search region for at least one free point, performs a first search for a first delay path from the source pin to a first free point, performs a second search for a second delay path from the sink pin to the first free point, combines the first and second delay paths to form a final delay path, and repeats the first and second searches until for each free point there is a final delay path connecting the free point to a source pin and a sink pin.

14. The delay router of claim 10 wherein:

the net length estimator determines a signal net boundary defined by a plurality of coordinates surrounding the signal net; and the search region constructor defines an outer search boundary as a function of the estimated wire length, the maximum delay constraint, and coordinates of the signal net boundary, and defines an inner search boundary as a function of the estimated wire length, the minimum delay constraint, and the coordinates of the signal net boundary, wherein the search region comprises an area between the outer and inner search boundaries.

15. The delay router of claim 14 wherein the outer search boundary comprises all points having a distance from the signal net boundary equal to one half of a difference between a maximum wire length constraint and the estimated wire length, where the maximum wire length constraint is computed from the maximum delay constraint.

16. The delay router of claim 14 wherein the inner search boundary comprises all points having a distance from the signal net boundary equal to one half of a difference between the minimum wire length constraint and the estimated wire length, where the minimum wire length constraint is computed from the minimum delay constraint.

17. The delay router of claim 10 further comprising:

a net scheduler for scheduling a list of signal nets to be matched, and for setting a net length constraint to a length of a longest routed path, wherein the search region constructor defines the search region for each signal net to be matched using the net length constraint.

18. The delay router of claim 10, wherein the maximum delay constraint is not equal to the minimum delay constraint.

19. In a delay router for delay routing a signal net any number of pins, and having maximum and minimum delay constraints, a computer implemented method of defining a search region around the signal net for locating within the search region a free point at which to place a pseudo pin for routing between two pins of the signal net, comprising:

determining a signal net boundary surrounding all of the pins of the signal net, the signal net boundary defined by a plurality of coordinates;

determining an estimated wire length for connecting all of the pins of the signal net;

defining an outer search boundary as a function of the estimated wire length, the maximum delay constraint, and the coordinates of the signal net boundary; and, defining an inner search boundary as a function of the estimated wire length, the minimum delay constraint, and the coordinates of the signal net boundary, wherein the search region comprises an area between the outer and inner search boundaries.

20. The method of claim 17, wherein the inner search boundary comprises:

all points having a distance from the signal net boundary equal to one half of a difference between the minimum wire length constraint and the estimated wire length, where the minimum wire length constraint is computed from the minimum delay constraint.

21. The method of claim 19, wherein the maximum delay constraint is not equal to the minimum delay constraint.

22. The method of claim 19 wherein determining an estimated wire length for connecting the signal net, comprises:

defining a one-trunk Steiner tree connecting all pins of the signal net, the estimated wire length equal to a total length of the one-trunk Steiner tree.

23. The method of claim 19, wherein the outer search boundary comprises:

all points having a distance from the signal net boundary equal to one half of a difference between a maximum wire length constraint and the estimated wire length, where the maximum wire length constraint is computed from the maximum delay constraint.

* * * * *